United States Patent
Heilman et al.

(10) Patent No.: US 10,892,615 B2
(45) Date of Patent: Jan. 12, 2021

(54) CIRCUIT FOR MITIGATING ELECTRIC SHOCK

(71) Applicant: ENERGY FOCUS, INC., Solon, OH (US)

(72) Inventors: Jeremiah A. Heilman, Rochester, MN (US); John M. Davenport, Tucson, AZ (US)

(73) Assignee: ENERGY FOCUS, INC., Solon, OH (US)

( * ) Notice: Subject to any disclaimer, the term of this patent is extended or adjusted under 35 U.S.C. 154(b) by 525 days.

(21) Appl. No.: 15/497,127

(22) Filed: Apr. 25, 2017

(65) Prior Publication Data
US 2018/0310370 A1    Oct. 25, 2018

(51) Int. Cl.
*H02H 11/00* (2006.01)
*H02H 5/12* (2006.01)
(Continued)

(52) U.S. Cl.
CPC ............... *H02H 5/12* (2013.01); *H05B 6/68* (2013.01); *H05B 45/50* (2020.01); *G01R 27/16* (2013.01); *H02H 1/003* (2013.01); *H02H 3/243* (2013.01)

(58) Field of Classification Search
CPC ...... H05B 6/68; H05B 6/666; H05B 33/0884; H02H 5/12; H02H 1/003; H02H 3/243; H02H 3/20; G01R 27/16
See application file for complete search history.

(56) References Cited

U.S. PATENT DOCUMENTS

| 5,625,258 A | 4/1997 | Preis |
| 9,270,143 B1 | 2/2016 | Mangiaracina et al. |

(Continued)

FOREIGN PATENT DOCUMENTS

| CN | 106163029 A | 11/2016 |
| CN | 106714395 A | 5/2017 |

(Continued)

OTHER PUBLICATIONS http://www.cfhtel.com; "Quotation of Wall Switch Control T8 LED Emergency Tube"; Shenzhen Chengfenghao Electronics Co., Ltd.; Jul. 13, 2016, 3 pages.

(Continued)

*Primary Examiner* — Rexford N Barnie
*Assistant Examiner* — Rasem Mourad
(74) *Attorney, Agent, or Firm* — Rankin, Hill & Clark LLP

(57) ABSTRACT

A circuit for mitigating electric shock including an external impedance detection circuit and a test and holdoff circuit. The external impedance detection circuit detects a presence of an external impedance, such as by detecting a relative change in voltage from a startup condition and a test condition. The test and holdoff circuit inhibits operation of a power converter which delivers power to be consumed by a load. The startup condition is defined by mains power applied to the circuit with negligible power consumed by a load. The test condition is defined by non-zero power delivered to the load. According to another aspect, the external impedance detection circuit measures an input voltage using a high input power which is greater than a shock hazard threshold at a duration less than a threshold time duration and determines the presence of the external impedance based on low pass filters having different time constants.

16 Claims, 4 Drawing Sheets

(51) Int. Cl.
*H05B 6/68* (2006.01)
*H05B 45/50* (2020.01)
*H02H 3/24* (2006.01)
*G01R 27/16* (2006.01)
*H02H 1/00* (2006.01)

(56) References Cited

U.S. PATENT DOCUMENTS

| | | | |
|---|---|---|---|
| 9,497,821 | B2 | 11/2016 | Liu |
| 9,521,718 | B2 | 12/2016 | Xiong et al. |
| 9,526,145 | B2 | 12/2016 | Xiong et al. |
| 9,585,221 | B1 | 2/2017 | Chen et al. |
| 9,587,817 | B2 | 3/2017 | Liu et al. |
| 10,123,388 | B2 | 11/2018 | Hsia |
| 10,225,905 | B2 | 3/2019 | Hsia |
| 10,237,946 | B1 | 3/2019 | Hsia |
| 2008/0151535 | A1 | 6/2008 | de Castris |
| 2009/0028321 | A1* | 1/2009 | Cheng ............ H04B 3/234 379/406.08 |
| 2010/0117558 | A1 | 5/2010 | Lee |
| 2011/0149563 | A1 | 6/2011 | Hsia et al. |
| 2012/0033746 | A1* | 2/2012 | Reilly ............ B60R 16/023 375/257 |
| 2012/0176714 | A1* | 7/2012 | Cheng ............ H02H 3/20 361/86 |
| 2012/0299494 | A1 | 11/2012 | Hartikka |
| 2012/0307524 | A1 | 12/2012 | Schapira et al. |
| 2013/0113393 | A1 | 5/2013 | Fujita et al. |
| 2013/0127362 | A1 | 5/2013 | Trainor et al. |
| 2013/0135852 | A1 | 5/2013 | Chan et al. |
| 2013/0328402 | A1 | 12/2013 | Noguchi |
| 2014/0015345 | A1* | 1/2014 | Ivey ............ H02H 9/02 307/326 |
| 2015/0062889 | A1 | 3/2015 | Kika |
| 2015/0163867 | A1 | 6/2015 | Recker et al. |
| 2016/0091149 | A1 | 3/2016 | Glachman |
| 2016/0174307 | A1* | 6/2016 | Tao ............ H05B 33/0809 315/85 |
| 2016/0348851 | A1 | 12/2016 | Amrine, Jr. et al. |
| 2017/0184294 | A1* | 6/2017 | Tao ............ F21V 25/04 |
| 2017/0268731 | A1 | 9/2017 | Vashi et al. |

FOREIGN PATENT DOCUMENTS

| | | |
|---|---|---|
| DE | 4342590 A1 | 6/1995 |
| GB | 2488845 | 9/2012 |
| GB | 2489513 | 10/2012 |
| WO | 2010/127366 A2 | 11/2010 |
| WO | 2016/154845 A1 | 10/2016 |

OTHER PUBLICATIONS http://www.cfhtel.com; "Quotation of T8 LED Emergency Tube with Remote Control"; Shenzhen Chengfenghao Electronics Co., Ltd.; Jul. 13, 2016, 3 pages.

http://www.itsuwaled.com/pd.jsp?id=6.com; Product Detail of "Emergency + Sensor T8 LED Tube"; Model YSH-T8XX-Y01-XX; Shenzhen Itsuwa Light Co., Ltd., Shenzhen, China, 12 Pages.

International Search Report and Written Opinion, PCT/US2017/033075, dated Mar. 19, 2018, 16 pages.

Office Action, U.S. Appl. No. 15/493,216, dated Jun. 29, 2018, 52 pages.

PCT Notification of Transmittal of the International Search Report and the Written Opinion of the International Searching Authority, or the Declaration; International Search Report; Written Opinion of the International Search Authority, dated May 23, 2017, 15 pages.

Office Action dated Jun. 28, 2018 from U.S. Appl. No. 15/458,497, filed Mar. 14, 2017, 20 pages.

International Search Report/Written Opinion dated Jul. 11, 2017, 15 pages.

http://www.comledbulb.com/sale-4194460-battery-backup-t8-emergency-led-tube.html; "Battery Backup T8 Emergency LED Tube", Brand Name: Romanso; Model No. RMS-T8-E3-18W-4F; Copyright 2015-2016 http://www.cornledbulb.com, 4 pages.

U.S. Office Action, U.S. Appl. No. 16/256,258, dated Mar. 4, 2019, 40 pages.

Office Action, U.S. Appl. No. 16/256,258 dated Oct. 31, 2019, 25 pages.

U.S. Final Office Action, U.S. Appl. No. 16/256,258, dated Jun. 28, 2019, 47 pages.

U.S. Final Office Action from U.S. Appl. No. 16/256,258, filed Jan. 24, 2019, dated Feb. 12, 2020, 35 pages.

* cited by examiner

CIRCUIT FOR MITIGATING ELECTRIC SHOCK

BACKGROUND

Tubular LED (TLED) lamps are meant to be energy efficient replacements for fluorescent (FL) lamps and have similar dimensions as FL lamps. For example, TLED lamps may be shaped as long tubes (e.g., be 2', 4', etc. in length) and have a pair of exposed metal pins on each end such that they fit in existing light fixtures. However, lamps may be designed to receive input power in an end-to-end fashion, thereby creating a potential shock hazard when the lamps are being replaced. In other words, when a TLED lamp having two ends has one end inserted into a live socket, this may introduce the possibility that pins on the other end of the TLED are live (e.g., due to a galvanic connection between the pins), resulting in these pins having a high voltage. Contact with these exposed pins can thus lead to a user or installer being electrically shocked.

BRIEF DESCRIPTION

According to one aspect, a circuit for mitigating electric shock is provided. The circuit may include an external impedance detection circuit and a test and holdoff circuit. The external impedance detection circuit is configured to detect a presence of an external impedance. The external impedance detection circuit is capable of detecting a relative change in voltage from a startup condition and a test condition. The startup condition is defined by mains power applied to the circuit with negligible power consumed by a load. The test condition is defined by non-zero power delivered to the load. The test and holdoff circuit limits or inhibits operation of a power converter which delivers power to the load. The external impedance is in series with the load, including the external impedance detection circuit, and the series combination of external impedance and load is in parallel with a source of electrical power.

In one or more embodiments, the external impedance detection circuit includes a first low pass filter and a second low pass filter. The first low pass filter and the second low pass filter can have different time constant values. For example, the first low pass filter can have a short time constant value of 50 ms and the second low pass filter can have a long time constant value of 500 ms.

The circuit can include a high frequency operation detection circuit determining a presence of high frequency operation for the load. The high frequency operation detection circuit can include a high pass filter. The high frequency operation detection circuit can determine the presence of high frequency operation for the load for frequencies greater than 6 kHz. The high frequency operation detection circuit can produce a non-zero signal when the frequency of input power is greater than a frequency threshold. The high frequency operation detection circuit can be used to override activation of the test and holdoff circuit.

The circuit can include a test and holdoff circuit limiting or inhibiting operation of a power converter for a predetermined amount of time. The load can be a lighting circuit. The test and holdoff circuit can disable function of the external impedance detection circuit after the test condition passes a test. The test and holdoff circuit can re-trigger function of the external impedance detection circuit after a predetermined amount of time when the test condition fails the test. Alternatively, the test and holdoff circuit can disable function of the converter indefinitely, resetting only with a power cycle.

According to one aspect, a circuit for mitigating electric shock is provided. The circuit can include an external impedance detection circuit and a test and holdoff circuit. The external impedance detection circuit detects a presence of an external impedance by measuring an input voltage using a high input power which is greater than a shock hazard threshold at a duration less than a threshold time duration and determining the presence of the external impedance based on two or more low pass filters having different time constants. The holdoff circuit inhibits operation of a power converter which delivers power to a load based on the presence of the external impedance. As an example, the shock hazard threshold can be 5 mA. The load can be a lighting circuit for operating one or more LEDs. A first low pass filter of the external impedance detection circuit can have a long time constant value greater than a short time constant value of a second low pass filter of the external impedance detection circuit.

The circuit for mitigating electric shock can include a mode circuit determining a fault condition based on a voltage of the second, short time constant low pass filter decreasing below a voltage of the first, long time constant low pass filter or a normal operation mode based on the voltage of the second, short time constant low pass filter increasing above the voltage of the first, long time constant low pass filter. The test and holdoff circuit can inhibit operation of the power converter based on the mode circuit determining the fault condition. The mode circuit can include a comparator.

According to one aspect, a circuit for mitigating electric shock is provided. The circuit can include an external impedance detection circuit configured to detect a presence of an external impedance. The external impedance detection circuit is capable of detecting a relative change in voltage from a startup condition and a test condition. The startup condition is defined by mains power applied to the circuit with negligible power consumed by a load. The test condition is defined by non-zero power delivered to the load. The circuit can include a test and holdoff circuit inhibiting operation of a power converter which delivers power to the load based on the relative change in voltage.

DETAILED DESCRIPTION

Figure 1:
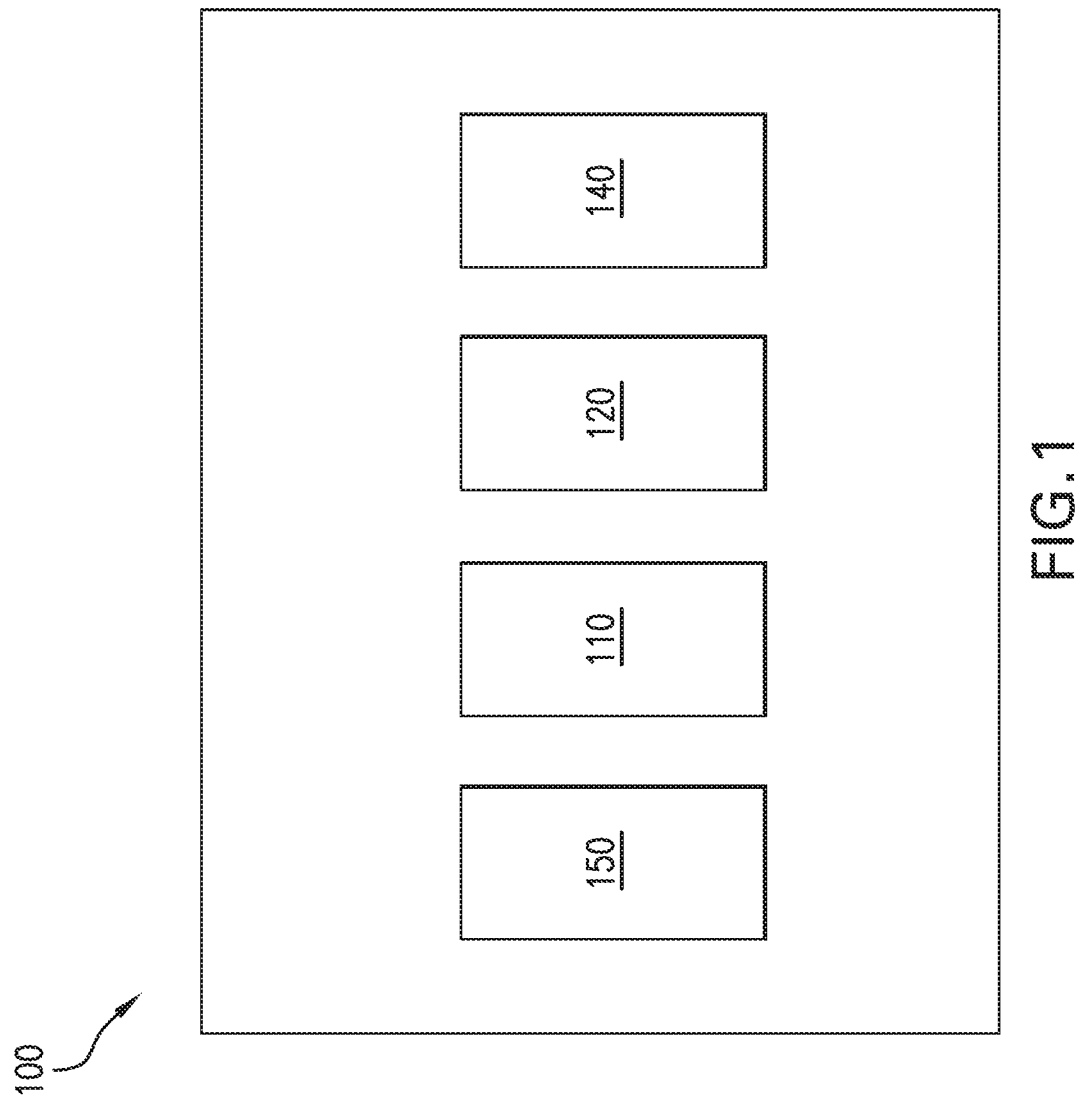
FIG. 1 is an illustration of an example block diagram of a circuit for mitigating electric shock, according to one or more embodiments.

FIG. 1 is an illustration of an example block diagram 100 of a circuit for mitigating electric shock, according to one or more embodiments.

Although described in the context of lighting circuitry for TLED lamps, the circuit for mitigating electric shock can be utilized for mitigating shock in other applications by disconnecting input power or input current when external impedance is generally detected.

Returning to the context of LED lighting, for example, when a lamp receives power from a power main source in a normal mode (e.g., non-fault mode or mode where no external impedance, such as from human contact with a portion of a circuit, is present), there is generally negligible impedance from an input source. As a result, the input voltage is not strongly affected by the amount of power brought into the circuit and delivered to an LED lamp.

However, a shock hazard scenario, such as when an individual is in contact with an exposed pin of an LED lamp, results in an additional impedance or external impedance due to the conduction through the person in contact with the exposed pins, thereby causing a decrease in the input voltage as power is delivered to the load (e.g., the LED lamp). The body impedance model, illustrated in FIG. 4, may be used as a reference for external impedance.

The circuit for mitigating electric shock can include a voltage divider 110, an external impedance detection circuit 120, a test and holdoff circuit 140, and a high frequency operation detection circuit 150. The external impedance detection circuit 120 can be configured to detect a presence of an external impedance. In other words, circuitry of the external impedance detection circuit 120 can be configured to detect a non-negligible impedance present in a fault condition where a shock hazard is likely. As an example, this can be based on detecting a relative change in voltage from a startup condition to a test condition, where the startup condition is defined by mains power applied to the circuit with negligible power consumed by a load and the test condition is defined by non-zero power delivered to the load.

The external impedance detection circuit 120 can be configured to detect the presence of the external impedance by measuring an input voltage with two or more low pass filters having different time constants, as will be described in greater detail herein. Because the external impedance detection circuit 120 measures voltages as a relative change based on startup and test conditions, the circuit for mitigating electric shock can operate or detect shock hazards for a wide range of allowable in supply voltages.

Stated another way, the external impedance detection circuit 120 is configured to discover if a load is connected to power in a normal mode or in a fault mode (e.g., fault condition). As used herein, normal mode means that the load receives power from an appropriate power source, such as the power mains, characterized by a negligibly low external impedance. Fault mode or a fault condition is defined as a condition whereby an electrical connection is completed through an external object, such as a person, such that an electric shock can occur (e.g., through the limbs, chest, hands, etc. of the person or individual). The external impedance detection circuit 120 is configured to discover a fault mode or fault condition based on detecting the presence of a non-negligible external impedance.

The external impedance detection circuit 120 utilizes two low pass filters with different time constants. The first low pass filter may have a long time constant, such as 300 ms, and represents average input voltage. The second low pass filter may have a short time constant, such as 15 ms, and represents instantaneous or near-instantaneous voltage. Both first and second filters are configured such that the output voltage of the second filter is equal to or greater than the output voltage of the first filter in normal mode. When transitioning from a startup condition to a test condition, the presence of an external impedance will cause input voltage to drop. As such, the voltage of the second, short time constant filter will drop faster than that of the first, long time constant filter. This can be detected, for example, with a comparator, ratiometric threshold detector, or Schmitt trigger.

The voltage divider 110 can be a noise reduction circuit which improves immunity to noise for the circuit for mitigating electric shock.

The test and holdoff circuit 140 can be configured to shut down operation of a power converter which delivers power to a load. In this way, the test and holdoff circuit 140 can reduce or cease input current associated with the power converter, thereby mitigating exposure to shock hazards by shutting down operation of a circuit (or associated LED lamp). For example, when the load is a lighting circuit, the test and holdoff circuit 140 can shut down LED lamp operation to mitigate a shock hazard when an external impedance is detected.

In this way, the circuitry of the test and holdoff circuit 140 utilizes discovery of a fault condition (e.g., failed test condition) to inhibit operation of a power converter quickly, thereby mitigating any shock hazard. Examples of fault conditions include detection of an external impedance or detection of an external impedance without a frequency of operation being greater than a frequency threshold.

The test and holdoff circuit 140 can temporarily inhibit operation of a power converter for a predetermined amount of time. In other words, the circuitry of the test and holdoff circuit 140 imposes a delay before re-attempting to import power to the power converter, so as not to pose a hazard from repeated exposure to electric shock.

In some scenarios, the test and holdoff circuit 140 can be configured to enable operation of the power converter even when an external impedance is detected, such as when a lamp is operated from an electronic ballast. In other words, an external impedance is not necessarily indicative of a fault condition because an allowable external impedance can be present or desirable in some scenarios.

In these scenarios, the high frequency operation detection circuit 150 can enable operation of the power converter by bypassing or disabling the external test and holdoff circuit 140. Because a lamp being operated from an electronic ballast operates at high frequencies, a determination that a circuit is operating at a frequency greater than an associated frequency threshold can be used to detect the high frequency operation (caused by the external ballast) and disable the test and holdoff circuit 140.

One can appreciate that multiple methods exist for the high frequency operation detection circuit 150 to override the function of external impedance detection. For example, the test and holdoff circuit 140 can suppress input from the external impedance detection circuit 120. Alternatively, the high frequency operation detection circuit 150 can disable the external impedance detection circuit 120, for example, by disabling the comparator. Any of these can be considered equivalent methods of allowing operation when high frequency input is detected, regardless of an indication from the external impedance detection circuit 120.

Thus, the circuit for mitigating electric shock of FIG. 1 can detect a fault condition when the circuit is operating at a frequency below the frequency threshold (e.g., AC mains frequency) and not when the circuit is operating at a frequency above the frequency threshold. In other words, the high frequency operation detection circuit 150 can override the function of the test and holdoff circuit 140 when a frequency representative of operation of an electronic ballast is measured, thereby enabling continuous operation of an LED lamp at a high frequency (e.g., greater than the frequency threshold or at a ballast frequency) while detecting abnormal impedance at the AC mains frequency.

The test and holdoff circuit 140 is configured to cause the circuit for mitigating electric shock to re-try or re-attempt to import power to the power converter or supply current to a load based on a fault condition. In one or more embodiments (not shown in FIG. 1), the external impedance detection circuit 120 can be disabled when a test condition passes. According to one aspect, this can be achieved by monitoring the output of the high frequency operation detection circuit 150 and the output of the external impedance detection circuit 120 (at comparator U1). In this way, if a test condition fails, a re-try will occur. If the test condition passes, power will be applied to the load, and the external impedance detection circuit 120 is disabled.

The circuit for mitigating electric shock can also be designed to have input power be provided as short pulses which are less than a threshold time duration. An example of the threshold time duration could be 100 ms (or less). In one or more embodiments, when the input power is provided as a pulse less than a threshold time duration, a higher level of power (e.g., associated with an input power greater than a shock hazard threshold) is pulled into a load (e.g., an LED lamp) associated with the circuit to create or cause a greater magnitude in voltage drop when the input voltage is measured at an input power greater than a shock hazard threshold or between an associated startup condition and test condition. However, because the higher level of power is associated with the input power greater than the shock hazard threshold, the associated current for this higher level of power is drawn as a short pulse having a time duration less than the threshold time duration (e.g., indicated as 100 ms or less).

Because the external impedance detection circuit 120 is capable of detecting a relative change in voltage between a startup condition and a test condition, the circuit for mitigating electric shock can scale with input voltage. In other words, the external impedance detection circuit 120 is capable of detecting a change between the startup condition and the test condition as a ratio, rather than merely as a fixed value. For example, if a fixed value external impedance detection circuit were configured to monitor for impedance based on a fixed threshold based on a 120 VAC input voltage, an external impedance may be determined if the voltage drops below 100 VAC. However, this external impedance detection circuit would not be compatible with an input voltage based on a 277 VAC adapter because it would be unlikely that enough external impedance would cause the detection circuit to drop below 100 VAC.

In this way, the circuit for mitigating electric shock enables a double ended TLED lamp to be installed in a lighting fixture while mitigating any continuous shock hazard caused by exposure of pins on an end of the TLED lamp. Further, little to no labor would be required to apply such circuits to existing light fixtures, thereby lowering the barrier to adoption of LED lamps for new or retrofit installations.

In other embodiments, the circuit for mitigating electric shock can be designed such that the circuit presents a lower risk of shock by continuously operating below a shock hazard limit or a shock hazard threshold. As an example, the shock hazard threshold can be set to 5 mA (RMS). Further, the shock hazard threshold can be a function of operating frequency of a circuit in that the threshold can be increased as frequency increases. In these embodiments, the external impedance detection circuit 120 can detect the presence of an external impedance or contact associated with being shocked by measuring an input voltage with zero input power and measuring voltage while drawing the continuous, low value of power below the shock hazard threshold (e.g., <5 mA RMS). Here, the test and holdoff circuit 140 can determine a fault condition or fault mode based on the input voltage dropping greater than a threshold amount or by a threshold factor.

In other words, when the input voltage measured by the external impedance detection circuit 120 drops a significant amount (e.g., defined by a threshold or threshold factor), the test and holdoff circuit 140 can disable operation of a corresponding power converter because this voltage drop is indicative of a fault condition or fault mode. As an example, the shock hazard threshold is 5 mA at frequencies below 100 Hz and fault condition impedance is 2000 Ohms at these frequencies, the resulting shock hazard threshold is 10V. Thus, the threshold voltage drop may be defined as 5V or more, for example. As another example, if the shock hazard threshold at 400 Hz is 5.7 mA and fault condition impedance is 1521 Ohms, the shock hazard threshold is 8.6V. Thus, the threshold voltage drop may be defined as 4.3V or more, for example.

Figure 2:
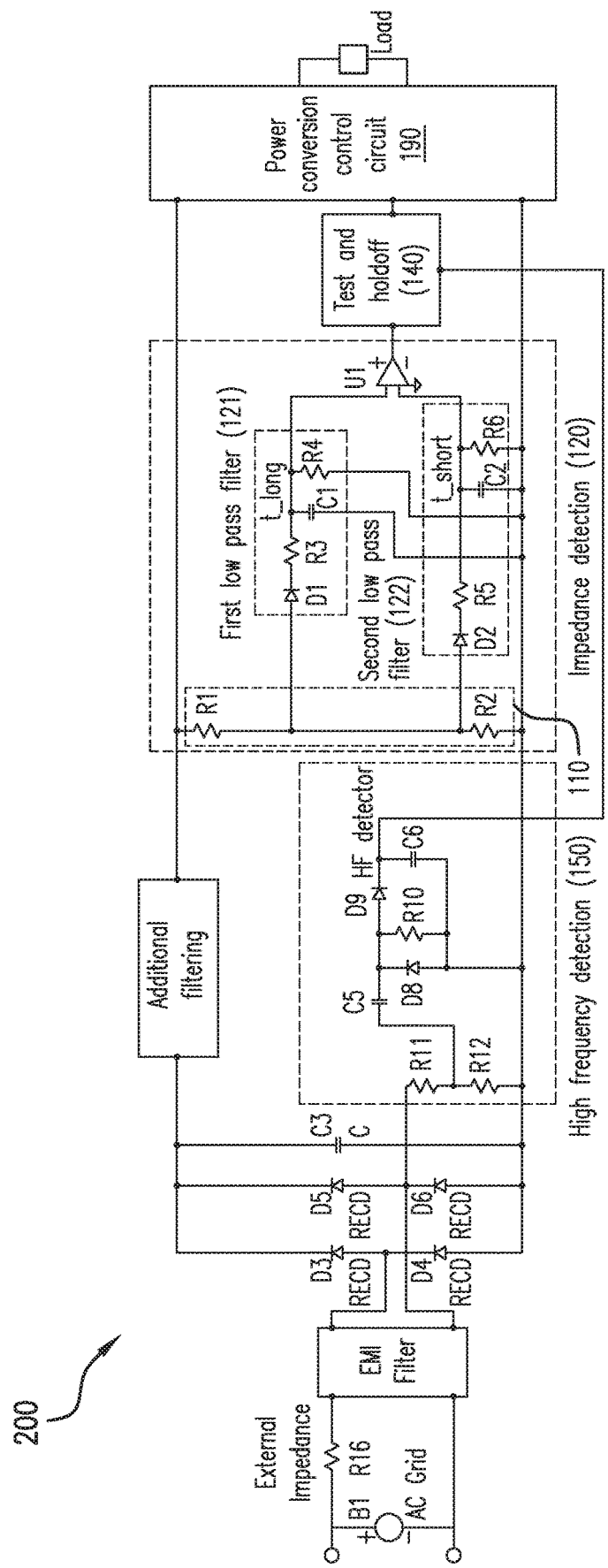
FIG. 2 is an illustration of an example schematic diagram of a circuit for mitigating electric shock, according to one or more embodiments.

FIG. 2 is an illustration of an example schematic diagram 200 of a circuit for mitigating electric shock, according to one or more embodiments. As seen in FIG. 2, the circuit for mitigating electric shock can include a voltage divider circuit (having two resistors), a first low pass filter 121, a second low pass filter 122, a test and holdoff circuit 140, a high frequency operation detection circuit 150, among other components (e.g., power source B1, diodes D3, D4, D5, D6, capacitor C3, comparator U1, the power conversion control circuit 190, etc.).

Together, the two low pass filters 121 and 122 of FIG. 2 form one embodiment of an external impedance detection circuit 120 capable of detecting a relative change in voltage between a startup condition and a test condition. Here, in this embodiment, the circuitry of 121 and 122 utilizes two low pass filters, each having a different time constant to enable detection of the external impedance. For example, the first low pass filter 121 can be associated with a long time constant (e.g., while the second low pass filter 122 can be associated with a short time constant (e.g., $t_{short}$). As previously discussed, the long time constant may be 500 ms, while the short time constant could be 100 ms or 50 ms. Regardless, one of the time constants is indicative of an average input voltage, while the other time constant is indicative of a current or recent input voltage. In this example, the time constant of the first low pass filter 121 represents the average input voltage while the time constant of the second low pass filter 122 represents the recent input voltage.

As seen in FIG. 2, the low pass filters 121 and 122 depicted are RC type low pass filters, each having a diode and a resistor in series with a load, and a capacitor and second resistor in parallel with the load. For example, the first low pass filter 121 has diode D1 in series with resistor R3 and capacitor C1 in parallel with resistor R4 with the output at $t_{long}$. Similarly, the second low pass filter 122 has diode D2 in series with resistor R5 and capacitor C2 in parallel with resistor R6 with the output at $t_{short}$. However, other types or configurations of low pass filters can be utilized.

At the startup condition, since no current is being supplied to the load (e.g., the LED lamp), the input voltage will acclimate to its average, regardless of input impedance, thereby causing the output of both low pass filter circuits 121 and 122 to be substantially equivalent.

Under the test condition, when power is exported to the load (e.g., LED lamp), if there is negligible input impedance (e.g., indicative of no contact with the pins of the LED), there should be no significant change in the input voltage, thereby resulting in substantially no change in the voltage level on either low pass filter circuit 121 and 122. In this way, a mode circuit (e.g., comparator U1) can determine a normal operation mode based on the external impedance detection circuit 120 (e.g., which can be formed by 121 and 122). In other words, a mode circuit can determine a normal operation mode indicative of a non-fault condition when there is no significant change in the input voltages associated with 121 and 122 between the startup and test conditions. A passing condition for the test is defined by the absence of an external impedance, while the failing condition is defined by a non-passing condition or the presence of the external impedance.

Conversely, under the test condition, when power is exported to the load, if there is an input impedance, input voltage will drop as a result, causing the voltage level of the short time constant low pass filter 122 to drop below the voltage level of the long time constant low pass filter 121 for a short period of time. Here, the mode circuit (e.g., comparator U1) determines a fault condition based on the deviation or change in the input voltages associated with 121 and 122 between the startup and test conditions. In other words, the mode circuit or comparator U1 can be used to denote the fault condition when a voltage of the second, short time constant low pass filter 122 decreases below a voltage of the first, long time constant low pass filter 121.

One can appreciate that a comparator circuit is a simple method of comparing two voltages to achieve a greater than/less than result, and that other methods exist to achieve the same or similar results.

To improve immunity to noise, the two low pass filters 121 and 122 can be configured with an offset in voltage divider offset (not shown in FIG. 2), such that the long time constant low pass filter 121 has a lower steady-state voltage than the short time constant low pass filter 122. As an example, the long time constant low pass filter 121 can be configured to divide the input voltage by 105, while the short time constant low pass filter 122 can be configured to divide the input voltage by 100. In this example, the short time constant low pass filter would have to decrease more than 5% in a short period of time to be detected as a fault condition. In other embodiments, the noise immunity could be implemented by introducing hysteresis in the mode circuit or comparator U1.

The timeout and holdoff circuit 140 can be configured to provide a delay before power is re-introduced or another attempt is executed. This timeout circuit thus prevents rapid re-application of power to a load, by keeping the power conversion control circuit 190 in an off or hold-off state for a predetermined amount of time before startup is re-initiated.

The high frequency operation detection circuit 150 including R11, R12, C5, D8, R10, D9, and C6 form a high pass filter with clamping, to detect the presence of a high frequency input greater than a frequency threshold (e.g., which is indicative of ballast operation). The high pass filter of the high frequency operation detection circuit 150 enables the circuit for mitigating electric shock to be compatible with external ballasts, which are associated with an additional input impedance. For example, electronic ballasts are typically characterized by an operating frequency of 45 kHz, which is much higher than a mains frequency. To prevent false-positive identification of a shock hazard when operating on a ballast, the high pass filter of the high frequency operation detection circuit 150 produces a non-zero signal if the input is above a threshold frequency (e.g., 6 kHz) and a nominally zero signal if the frequency is below the threshold frequency or low (e.g., at the mains frequency). Thus, the output of the high frequency operation detection circuit 150 can be utilized to override function of the external impedance detection circuit 120.

In one or more embodiments, the shock hazard threshold current can be adjusted to be higher when operating at higher frequencies greater than the frequency threshold because the danger potential is less at the higher frequencies. Thus, the circuit for mitigating electric shock can be designed to operate continuously in this condition and not be in a fault condition.

Figure 3:
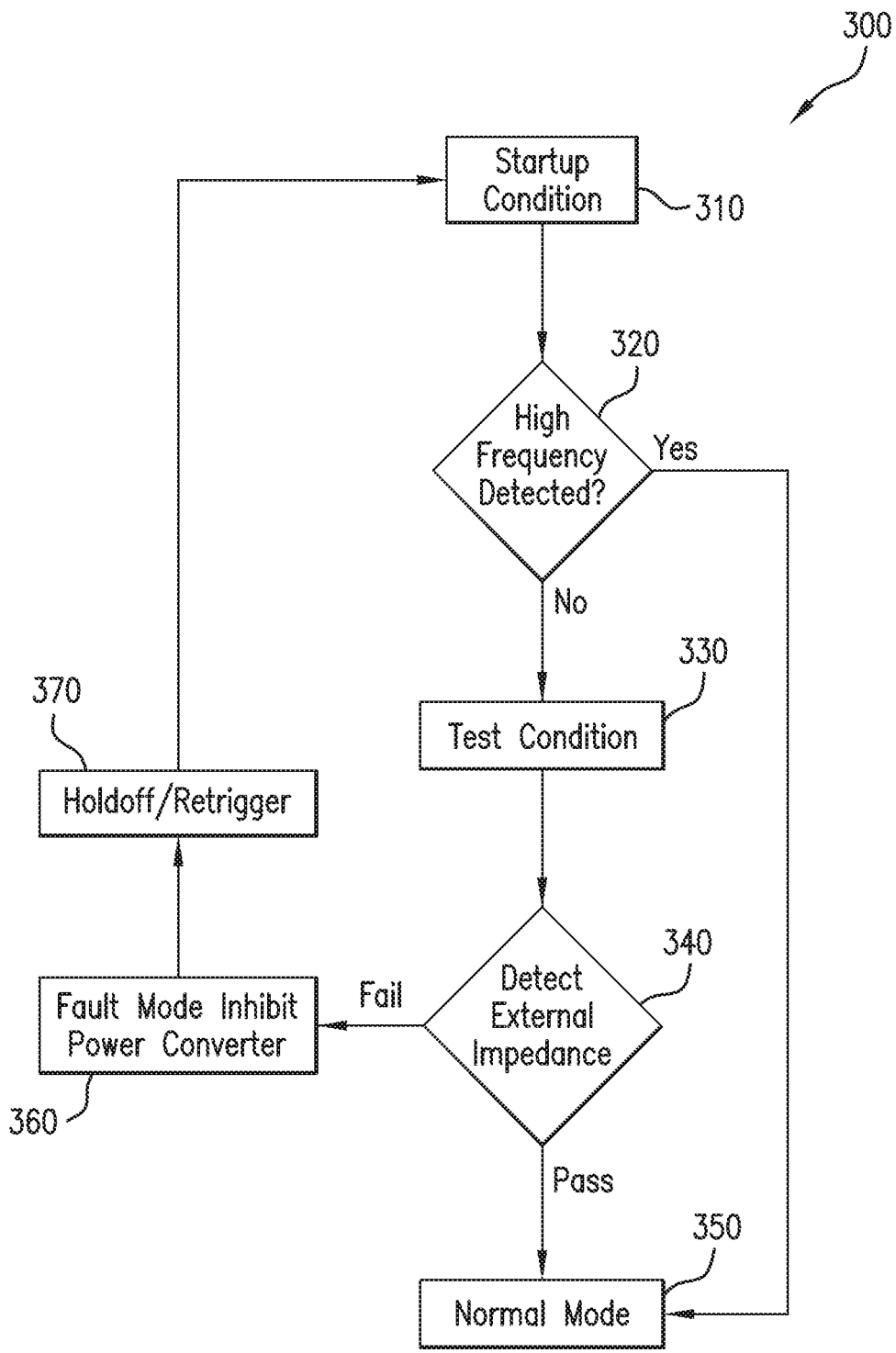
FIG. 3 is an illustration of an example flow diagram of a method for mitigating electric shock, according to one or more embodiments.

FIG. 3 is an illustration of an example flow diagram of a method 300 for mitigating electric shock, according to one or more embodiments. At startup condition 310, a startup condition is imposed, with negligible power being imported. At 320, detection of high frequency input is conducted. If high frequency is detected, all external impedance detection is bypassed. If low frequency is detected, proceed to detection of external impedance. At 330, a test condition is imposed by exporting power to the load. Input power greater than a shock hazard threshold may be present for a duration less than a threshold time duration. In other words, an input power greater than the shock hazard threshold is provided as a short pulse in order to measure the input voltage, and thus determine whether an external impedance is present. At 340, the presence or absence of the external impedance is determined based on voltages associated with two or more low pass filters having different time constants. If no external impedance is detected, normal mode is assumed and the method 300 proceeds to normal mode operation at 350, normal operation is imposed, which may include disabling the external impedance detection. Otherwise, if external impedance is detected, the method 300 proceeds to fault mode 360. Operation of a power converter is inhibited based on the determination of whether the external impedance (and/or operation of an electronic ballast or a high frequency operation greater than a frequency threshold) is present. At 370, a holdoff delay before retrigger is imposed before returning to startup condition 310.

Figure 4:
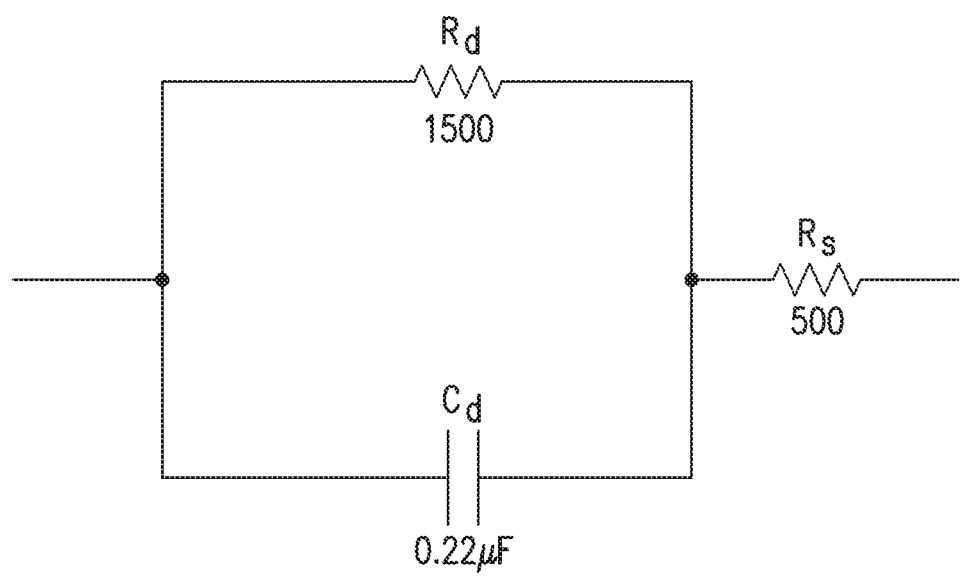
FIG. 4 is an illustration of a Body Impedance Model, representative of a standardized test circuit for an external impedance.

FIG. 4 is an illustration of a Body Impedance Model, representative of a standardized test circuit for an external impedance.

Although the subject matter has been described in language specific to structural features or methodological acts, it is to be understood that the subject matter of the appended claims is not necessarily limited to the specific features or acts described above. Rather, the specific features and acts described above are disclosed as example embodiments.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A circuit for mitigating electric shock, comprising:
an external impedance detection circuit detecting a presence of an external impedance, the external impedance detection circuit detecting a relative change in voltage from a startup condition and a test condition,
wherein the startup condition is defined by mains power applied to the circuit with negligible power consumed by a load,
wherein the test condition is defined by non-zero power delivered to the load; and
wherein the external impedance is in series with a source of electrical power;
a test and holdoff circuit inhibiting operation of a power converter which delivers power to the load if external impedance is detected,
wherein the external impedance detection circuit includes a first low pass filter having a first time constant equal to a value of a detected average input voltage in milliseconds and a second low pass filter having a second time constant equal to a value of a detected instantaneous voltage in milliseconds; and
a mode circuit including a comparator generating an input fed to the test and holdoff circuit, wherein the comparator compares an output of the first low pass filter and an output of the second low pass filter.

2. The circuit of claim 1, wherein the first low pass filter and the second low pass filter have different time constant values.

3. The circuit of claim 1, wherein the first low pass filter has a short time constant value of 50 ms and the second low pass filter has a long time constant value of 500 ms.

4. The circuit of claim 1, further comprising a high frequency operation detection circuit determining a presence of high frequency operation for the load, wherein the high frequency operation detection circuit comprises a high pass filter.

5. The circuit of claim 4, wherein the presence of high frequency operation for the load is determined for frequencies greater than 6 kHz.

6. The circuit of claim 4, wherein the high frequency operation detection circuit produces a non-zero signal when the frequency of operation is greater than a frequency threshold.

7. The circuit of claim 4, wherein the high frequency operation detection circuit is configured to override the test and holdoff circuit.

8. The circuit of claim 1, comprising a test and holdoff circuit temporarily inhibiting operation of the power converter for a predetermined amount of time.

9. The circuit of claim 1, wherein the load is a lighting circuit.

10. The circuit of claim 1, wherein the external impedance detection circuit is:
disabled after the test condition passes a test; or
re-triggered after a predetermined amount of time when the test condition fails the test; wherein
passing condition is defined by an absence of the external impedance; and
failing condition is defined by a non-passing condition.

11. A circuit for mitigating electric shock, comprising:
an external impedance detection circuit detecting a presence of an external impedance and measuring an input voltage drop which is greater than a shock hazard threshold at a duration less than a threshold time duration;
determining the presence of the external impedance based on two low pass filters having different time constants, wherein a first time constant is equal to a value of a detected average input voltage in milliseconds and a second time constant is equal to a value of a detected Instantaneous voltage in milliseconds;
a test and holdoff circuit inhibiting operation of a power converter which delivers power to a load based on the presence of the external impedance; and
a mode circuit including a comparator generating an input fed to the test and holdoff circuit, wherein the comparator compares an output of a first low pass filter of the two low pass filters having different time constants and an output of a second low pass filter of the two low pass filters having different time constants.

12. The circuit of claim 11, wherein the shock hazard threshold is 5 mA.

13. The circuit of claim 11, wherein the load is a lighting circuit for operating one or more LEDs.

14. The circuit of claim 11, wherein the first low pass filter of the external impedance detection circuit has a long time constant value greater than a short time constant value of the second low pass filter of the external impedance detection circuit.

15. The circuit of claim 14, comprising the mode circuit determining: a fault condition based on a voltage of the second, short time constant low pass filter decreasing below a voltage of the first, long time constant low pass filter, wherein the test and holdoff circuit inhibits operation of the power converter based on the mode circuit determining the fault condition; or a normal operation mode based on the voltage of the second, short time constant low pass filter increasing above the voltage of the first, long time constant low pass filter.

16. A circuit for mitigating electric shock, comprising:
an external impedance detection circuit detecting a presence of an external impedance, the external impedance detection circuit detecting a relative change in voltage from a startup condition and a test condition,
wherein the startup condition is defined by mains power applied to the circuit with negligible power consumed by a load,
wherein the test condition is defined by non-zero power delivered to the load;

a test and holdoff circuit inhibiting operation of a power converter which delivers power to the load based on the relative change in voltage, wherein the external impedance detection circuit includes a first low pass filter having a first time constant equal to a value of a detected average input voltage in milliseconds and a second low pass filter having a second time constant equal to a value of a detected instantaneous voltage in milliseconds; and a mode circuit including a comparator generating an input fed to the test and holdoff circuit, wherein the comparator compares an output of the first low pass filter and an output of the second low pass filter.

* * * * *